United States Patent [19]

Tower

[11] Patent Number: 4,811,371
[45] Date of Patent: Mar. 7, 1989

[54] FLOATING-DIFFUSION ELECTROMETER WITH ADJUSTABLE SENSITIVITY

[75] Inventor: John R. Tower, Burlington County, N.J.

[73] Assignee: RCA Corporation, New York, N.Y.

[21] Appl. No.: 863,794

[22] Filed: May 16, 1986

[51] Int. Cl.[4] .................. G11C 19/28; H01L 29/78
[52] U.S. Cl. ................................. 377/60; 357/24
[58] Field of Search .......................... 357/24, 57–63

[56] References Cited

U.S. PATENT DOCUMENTS

| | | | |
|---|---|---|---|
| 4,513,431 | 4/1985 | Chamberlain et al. | 377/60 |
| 4,590,505 | 5/1986 | Bluzer | 377/60 |
| 4,631,739 | 12/1986 | Handy | 377/60 |
| 4,660,064 | 4/1987 | Hamasaki | 377/60 |

OTHER PUBLICATIONS

Scott B. Stetson, "A Controllable Piecewise Linear-Output Circuit for CCD Multiplexers", *IEEE Transactions on Electron Devices*, vol. ED-32, No. 8, Aug. 1985.

*Primary Examiner*—Gene M. Munson
*Attorney, Agent, or Firm*—Clement A. Berard, Jr.; Raymond E. Smiley

[57] ABSTRACT

The effective capacitance of the floating diffusion in a floating-diffusion electrometer is modified to adjust electrometer sensitivity. This is done by changing the direct potential applied to a gate electrode proximate to the floating diffusion.

4 Claims, 2 Drawing Sheets

FLOATING-DIFFUSION ELECTROMETER WITH ADJUSTABLE SENSITIVITY

The invention described herein was made in the performance of work under NASA Contract No. NAS 5-27800 and is subject to the provisions of Section 305 of the National Aeronautics and Space Act of 1958 (72 Stat. 435; 42 U.S.C. 2457).

The present invention relates to electrometers, which convert signals in charge packet form to signals in voltage or current form, as may be used in solid-state imagers by way of example.

BACKGROUND OF THE INVENTION

In certain solid-state imagers, particularly one using a Schottky-barrier diode infrared detector array in combination with a charge-coupled device (CCD) multiplexer to provide for detector scanning, the dynamic range of useful photosensor response is greater than the range of linear response available from any prior-art electrometer of floating-diffusion type. This is also the case with certain visible-light-responsive CCD imagers as well. The prior-art floating-diffusion electrometer is described in United Kingdom Patent No. 1,377,126 published Dec. 11, 1974, issued to RCA Corporation on Apr. 9, 1975, and entitled "CHARGE COUPLED CIRCUITS".

A more recent prior-art floating diffusion electrometer includes a number of insulated gate field effect transistors of metal oxide semiconductor type. The first of these MOSFETs is connected at its gate electrode to the floating diffusion to sense the electrostatic potential induced thereon by a charge packet transferred thereto from the output port of a CCD. This first MOSFET may be operated as a source-follower for providing a electromotive force potential at its source electrode responsive to the electrostatic potential applied to its gate electrode from the floating diffusion, by way of example. Alternatively the first MOSFET may be operated as a common-source amplifier for supplying a drain current responsive to the electrostatic potential applied to its gate electrode. The floating diffusion is the virtual source electrode of a second, plural-gate electrode MOSFET having a drain electrode connected to a reference potential. The gate electrode of this second MOSFET closest to the floating diffusion is connected to a fixed gate potential. A gate electrode of this second MOSFET more remote from the floating diffusion is pulsed after each charge packet in the floating diffusion has had its amplitude sensed. This is done to render the channel of the second MOSFET conductive between the floating diffusion and its drain diffusion contacted by its drain electrode for connection to the reference potential. The conduction of the second MOSFET channel clamps the floating diffusion to reference potential and drains away the charge packet in the floating diffusion. This prepares the floating diffusion to accept the next charge packet transferred thereto by the CCD.

Experience with a Schottky-barrier diode detector array with CCD multiplexer and floating-diffusion electrometer has been as follows. The source-follower MOSFET in the floating diffusion electrometer has an acceptably linear dynamic range of 2 volts at its source electrode. The charge-to-voltage conversion factor of the source-follower is approximately one microvolt per electron. Thus, acceptably linear electrometer response is limited to $2 \cdot 10^6$ electrons. The Schottky-barrier diode detectors and CCD multiplexer can be designed with charge capacities in the range of $5 \cdot 10^6$ to $10^7$ electrons for practical pixel sizes and CCD multiplexer dimensions, however. It is desirable then to be able to increase the linear dynamic range of the floating diffusion electrometer by a factor of 2.5 to 5.

This is difficult to do. However, the wide dynamic ranges are seldom fully utilized in any imaging task. Rather, linear dynamic range is usually desired both for intense images and for weak images. It is possible then, particularly when an iris is used in the image optics, to achieve the benefits of very wide dynamic range by providing two less-wide linear dynamic ranges which together provide a piecewise-linear wide dynamic range. One may, of course, provide a larger number (e.g. three) of such less-wide linear dynamic ranges, to more closely piecewise approximate the results achievable with a very wide dynamic range.

To provide a plurality of dynamic ranges, one arranges to alter the electrometer sensitivity—i.e., the conversion ratio from floating diffusion charge to source-follower MOSFET source voltage. To understand the way this is done, consider the following equation descriptive of the conversion ratio.

$$V_{OUT}/Q_{SIG} = A_V/C_{FD}$$

where:
 $V_{OUT}$ = the source-follower source voltage swing responsive to the signal charge packet on the floating diffusion,
 $Q_{SIG}$ = the quantity of charge (in coulombs) in the signal charge packet,
 $A_V$ = the source-follower voltage gain, and
 $C_{FD}$ = the floating diffusion capacitance (in farads) including source-follower gate capacitance.

One can attempt to alter the conversion ratio by altering either $A_V$ or $C_{FD}$.

In an article entitled "A Controllable Piecewise Linear-Output Circuit for CCD Multiplexers" appearing in the August 1985 "IEEE TRANSACTIONS ON ELECTRON DEVICES" Vol. ED-32, No. 8, Pages 1538–1540, S. B. Stetson describes altering the conversion ration by selectively connecting additional capacitance to the floating diffusion. This connecting is done through the channel of a further MOSFET responsive to control signal applied to its gate electrode.

A substantially simpler structure than that described by Stetson will provide a piece-wise linear, very wide dynamic range, the present inventor finds.

SUMMARY OF THE INVENTION

A floating diffusion electrometer has a gate electrode receptive of direct potential proximate to the floating diffusion. The effective capacitance of the floating diffusion is modified to change electrometer sensitivity by changing the direct potential on the gate electrode proximate to the floating diffusion. In effect, this changes the expanse of the floating diffusion depletion area to alter the effective capacitance of the floating diffusion.

DETAILED DESCRIPTION

Figure 1:
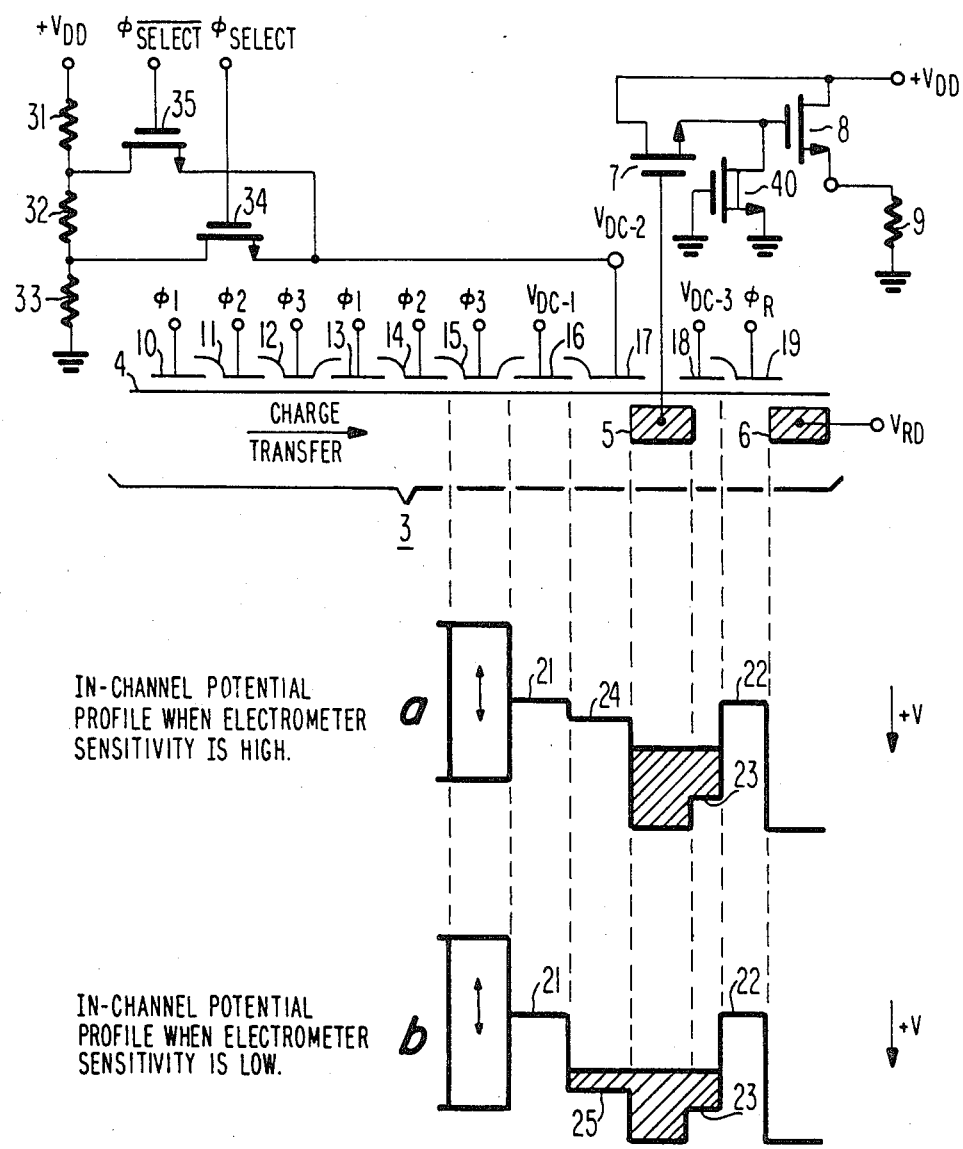
FIG. 1 is a diagram of an electrometer embodying the invention and also shows too in-channel potential profiles therefore.

In FIG. 1 the output circuit 3 of a solid state imager is shown. The line 4 represents the top surface of the semiconductor substrate on which the imager is constructed. Below this surface is a charge transfer channel extending from left to right in which a floating diffusion region 5 and a terminal reset drain 6 are disposed. This charge transfer channel may be surface-channel type, but is in present-day practice usually a buried-channel type. The charge transfer channel is usually bounded by flanking channel stop diffusions (not shown in FIG. 1, being in front of and in back of the diagrammed profile plane through the charge transfer channel).

A succession of gate electrodes 10–17 insulated from the top surface of the semiconductor substrate and from each other are included in the charge-coupled-device (CCD) structure used to transfer charge packets serially, one at a time, to floating diffusion 5 for sensing. Gate electrodes 10–15 are shown receiving the three phases $\phi_1$, $\phi_2$, $\phi_3$ of a three-phasing forward clocking signal, representative of the several known ways of forward clocking a CCD structure. Gate electrode 16 thereafter has a direct potential $V_{DC\text{-}1}$ applied thereto which is about equal to the midway value of the ($\phi_3$) voltage swing appearing in the last clocked gate electrode 15 of the input CCD structure. As may be discerned from the in-channel profiles a and b of FIG. 1 (hereinafter referred to as FIGS. 1a and 1b) $V_{DC\text{-}1}$ induces an electrostatic potential barrier 21 under gate electrode 16 that holds back transfer of a electron charge packet when $\phi_3$ is at its positiveward excursion. When $\phi_3$ is at its negativeward excursion, however, electron charge flows from under gate electrode 16 over the potential barrier 21 in the direction towards floating diffusion 5.

Gate electrode 16 is followed by a gate electrode 17 receptive of a direct potential $V_{DC\text{-}2}$, which in accordance with the invention may be either of two selected values depending on the electrometer sensitivity desired. In either case $V_{DC\text{-}2}$, is in effect more positive than $V_{DC\text{-}1}$, so charge flowing over the potential barrier 21 flows unimpeded to floating diffusion 5.

Each charge packet transferred to floating diffusion 5 alters the electrostatic potential thereon, which is applied to the gate electrode of an insulated-gate field effect transistor 7. Transistor 7 is conventionally a small-geometry device located in the semiconductor substrate. Its small gate capacitance allows electrometer sensitivity to be high when it is desired that it be high. Transistor 7 is shown in source-follower connection, with its drain electrode connected to a positive operating supply voltage $+V_{DD}$, and with its source electrode connected to a source load shown as a self-biased depletion-mode insulated-gate field effect transistor 40. Transistor 40 is generally constructed as a buried-channel device. The source electrode of source-follower transistor 7 also connects to the gate electrode of another insulated-gate field effect transistor 8. Transistor 8 is conventionally a larger-geometry device, also located on the semiconductor substrate and connected in source-follower configuration with its drain electrode connected to operating supply voltage $+V_{DD}$. The source-follower connection of transistor 8 includes a resistive load 9 between its source electrode and ground, which load is conventionally located off the semiconductor substrate so dissipation therefrom does not heat the imager.

In each charge sensing operation the electrostatic potential placed on floating diffusion 5 by the charge packet just transferred thereto is converted by the source-follower action of transistor 7 to an electromotive force (EMF) potential at its source electrode. This EMF potential can support current flow to charge and discharge the gate electrode capacitance of the larger-geometry transistor 8. Then by source-follower action, transistor 8 converts the EMF potential as its gate electrode to an EMF potential at its source electrode that can support current flow to a relatively low resistance load 9, to achieve video bandwidth response despite appreciable capacitance being associated with the load.

After the amplitude of each charge packet on floating diffusion 5 is sensed, it is drained away to reset drain diffusion 6 to ready floating diffusion 5 to receive the next charge packet whose amplitude is to be sensed. This draining away is the so-called "reset" procedure in which the $\phi_R$ signal voltage applied to reset gate electrode 19 rises in a positive-going pulse from a potential level that establishes a barrier 22 to charge transfer under the gate electrode 19. Reset drain diffusion 6 has a reset drain voltage applied to it that is more positive than the electrostatic potentials in the CCD structure used to transfer charge packets to floating diffusion 5. The lowering of the barrier 22 to charge transfer, when $\phi_R$ is positively pulsed, allows charge flow from floating diffusion 5 towards reset drain 6. Charge drains away from floating diffusion 5 until the charge level no longer exceeds the very low barrier 23 to charge flow which is induced under gate electrode 18 responsive to application of direct potential $V_{DC\text{-}3}$ to gate electrode 18. Per custom, gate electrode 18 is a narrow, short gate electrode to keep its associated capacitance low, so as not to reduce electrometer sensitivity. Since this gate is short, the fringing field under reset gate electrode 19 usually depresses the very low barrier 23 during reset, so charge continues to drain away from floating diffusion 5 until its electrostatic potential reaches the well-defined electromotive force potential $V_{RD}$ applied to reset drain diffusion 6.

The adjustment of electrometer sensitivity in accordance with the invention, to achieve piecewise linear dynamic range wider than the normal linear dynamic range of a floating diffusion electrometer, will now be described.

Suppose the image received by the solid-state imager is weak in intensity, so high electrometer sensitivity is required. Then, as shown in FIG. 1a, $V_{DC\text{-}2}$, the potential applied to gate electrode 17 preceding the floating diffusion 5, is of a value to induce electrostatic potential in the portion of the charge transfer channel under gate electrode 17 only slightly more positive than the barrier 21 to charge transfer. This value of $V_{DC\text{-}2}$ is shown in FIG. 1 as being developed from $+V_{DD}$ by the potential divider action between, on the one hand, the series connection of resistors 31 and 32, and, on the other hand, a resistor 33. This value of $V_{DC\text{-}2}$ is shown as being selectively applied by conduction through the drain-to-source path of an n-channel field effect transistor 34 responsive to its insulated gate electrode receiving a positive $\phi_{SELECT}$ signal Another n-channel field effect transistor 35 contemporaneously receives a negative $\phi_{SELECT}$ signal at its insulated gate electrode, so its drain-to-source path is non-conductive. Gate electrode 17, through wide and long, augments the capacitance of the floating diffusion only slightly. So by Coulomb's Law the voltage developed by a given size charge packet is relatively large, given the relatively small effective capacitance of floating diffusion 5.

Suppose the image received by the solid-state imager is strong in intensity, so lowered electrometer sensitivity is required. Then, as shown in FIG. 1b, $V_{DC-2}$, the potential applied to gate electrode 17 preceding the floating diffusion 5, is of a value to induce electrostatic potential in the portion of the charge transfer channel under gate electrode 17 much more positive than the barrier 21 to charge transfer. This value of $V_{DC-2}$ is shown in FIG. 1 as being developed from $+V_{DD}$ by the potential divider action between, on the one hand, resistor 31 and, on the other hand, the series connection of resistors 32 and 33. This value of $V_{DC-2}$ is shown as being selectively applied by conduction through the drain-to-source path of n-channel field effect transistor 35 responsive to its insulated gate electrode receiving a positive $\phi_{SELECT}$ signal. The n-channel field effect transistor 34 contemporaneously receives a negative $\phi_{SELECT}$ signal at its insulated gate electrode, so its drain-to-source path is non-conductive. Gate electrode 17, being wide and long and receiving a well-inducing potential, augments the capacitance of the floating diffusion substantially. So by Coulomb's Law the voltage developed by a given size charge packet is relatively small, given the relatively large effective capacitance of floating diffusion 5.

Rather than using a gate electrode 16 in the CCD input to floating diffusion 5 to selectively augment the effective capacitance of floating diffusion 5, a conventional CCD input structure may be used in which gate electrode 16 is not separated from floating diffusion 5 by space for $V_{DC-2}$-receptive gate electrode 7. In such case a $V_{DC-2}$-receptive gate electrode at the side of the charge transfer channel may be used instead of gate electrode 17 to control the effective capacitance of the floating diffusion. That is, the $V_{DC-2}$-receptive gate electrode need not be located over the charge transfer path into floating diffusion 5. The practical problem with this alternative approach as thusfar described is that usually the length of the floating diffusion is smaller than the width of the floating diffusion. This restricts the geometry of side-locate $V_{DC-2}$-receptive gate electrode so the extraction of charge from under that $V_{DC-2}$-receptive gate electrode during reset is relatively slow. To overcome this problem the narrow short gate electrode 18, reset gate electrode 19, and reset drain 6 may be located to the side, and the $V_{DC-2}$-receptive gate electrode may be located on the opposite side of floating diffusion 5 from gate electrode 16.

Figures 2, 3:
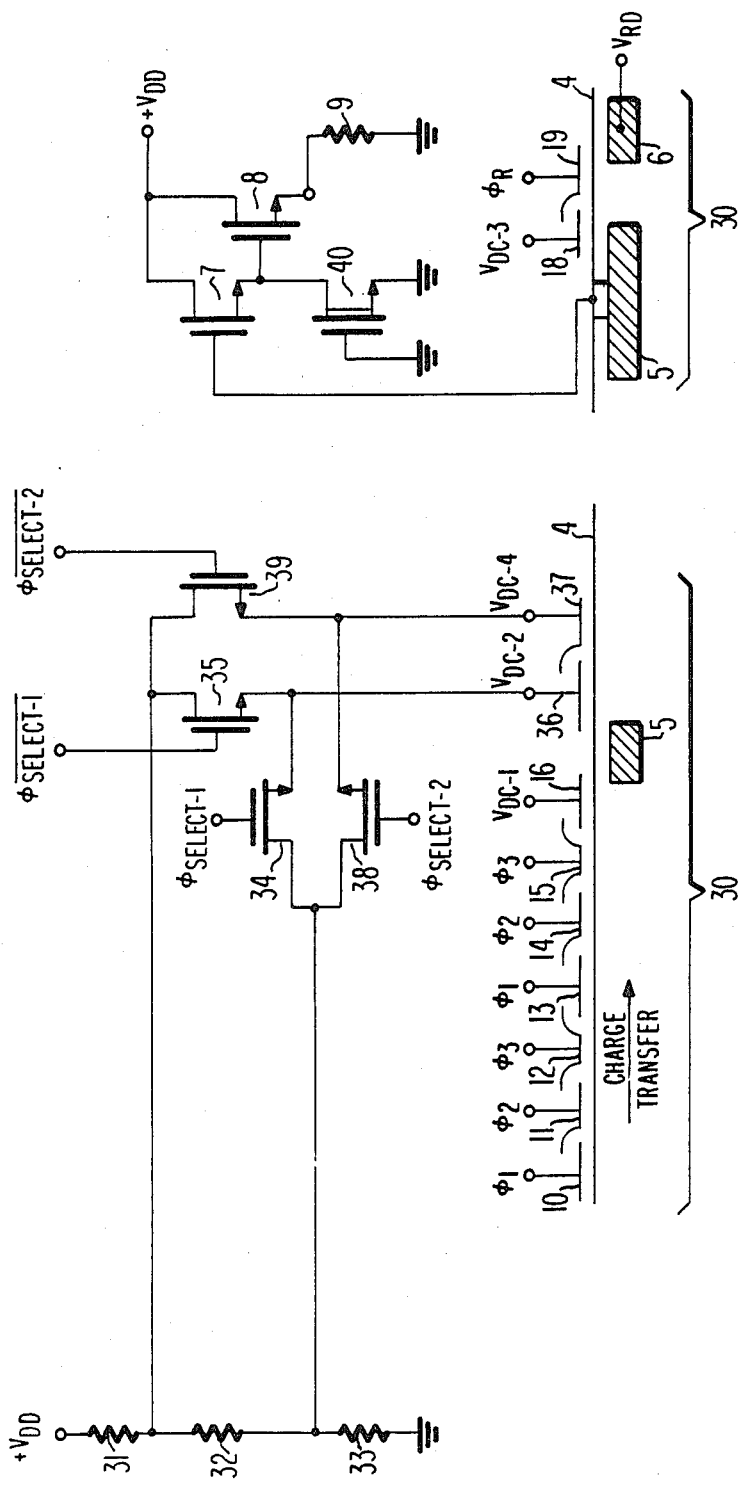
FIGS. 2 and 3 diagram, in two "views", another electrometer embodying the invention.

FIGS. 2 and 3 show an electrometer of this construction. FIG. 2 shows in profile the length of the charge transfer channel into floating diffusion 5 the length of floating diffusion 5, and the length of a $V_{DC-2}$-receptive gate electrode 36 on the opposite side of floating diffusion 5. FIG. 3 shows in profile the width of floating diffusion 5, the lengths of gate electrodes 18 and 19, and the length of reset drain 6. For purposes of clarity, the electrometer FETs 7, 8, 40 and load resistor 10 are shown only in FIG. 3; and the $V_{DC-2}$ developing and applying elements 31-35 are shown only in FIG. 2.

FIG. 2 also illustrates how easily piecewise linearity of dynamic range may be extended further in accordance with the invention. Another gate electrode 37 receives a direct potential $V_{DC-4}$ selectively switched between the same two values as direct potential $V_{DC-2}$ is. When FET 38 is switched into conduction responsive to $\phi_{SELECT-2}$ being more positive, and FET 39 is switched out of conduction responsive to $\phi_{\overline{SELECT-2}}$ at the same time being more negative, gate electrode 37 is inoperative to increase the effective capacitance of floating diffusion 5. Conditional on gate electrode 36 being operative to increase the effective capacitance of floating diffusion 5, gate electrode 37 is operative to increase the effective capacitance still further when FET 38 is switched out of conduction responsive to $\phi_{SELECT-2}$ being more negative and FET 39 is switched into conduction responsive to $\phi_{\overline{SELECT}}$ at the same time being more positive.

Piecewise linearity of dynamic range may be extended further in a modified FIG. 1a electrometer also, by replacing gate electrode 17 with a succession of gate electrodes to which switched direct potentials are applied. In these structures extending piecewise linearity still further, care should be taken that charge can be drained from under the gate electrode distal from floating diffusion 5, to under the gate electrode proximal to floating diffusion 5, to floating diffusion 5. To permit the same positive potentials being applied to both the distal and proximal gate electrodes (e.g. 36, 37), when both their capacitances are to augment floating diffusion capacitance substantially, it is convenient to place the proximal gate electrode closer to the top surface 4 of the semiconductive substrate than the distal gate electrode.

Modification of the FIG. 1a electrometer where an additional gate electrode receptive of switched direct potential flanks the floating diffusion 5 on one side or on each side are also possible, in other embodiments of the invention.

What is claimed is:

1. A floating-diffusion electrometer of the type including an electrometer field effect transistor, a floating diffusion disposed in a semiconductor substrate and electrically connected to the gate of said electrometer field effect transistor, and a charge transfer path in said semiconductor substrate for transferring charge to said floating diffusion, the effective area of the floating diffusion parallel to the top surface of said semiconductor substrate controlling the sensitivity of said floating-diffusion electrometer, improved to further include:

a gate electrode insulated from aid semiconductor substrate and located proximate to said floating diffusion;

means for applying to said gate electrode, when relatively high electrometer sensitivity is required, a potential which confines the effective area of said floating diffusion; and means for applying to said gate electrode, when relatively low electrometer sensitivity is required, a potential which expands the effective area of said floating diffusion..

2. An improved floating-diffusion electrometer of the type set forth in claim 1 wherein said gate electrode is interposed over the charge transfer path in said semiconductor substrate for transferring charge to said floating diffusion.

3. An improved floating-diffusion electrometer of the type set forth in claim 1 wherein said gate electrode is located at a side of said floating diffusion other than that side of floating diffusion to which charge is transferred by said charge transfer path.

4. An improved floating-diffusion electrometer of the type set forth in claim 3 wherein said gate electrode is located at the side of said floating diffusion opposite to that side of said floating diffusion to which charge is transferred by said charge transfer path.

* * * * *

UNITED STATES PATENT AND TRADEMARK OFFICE
CERTIFICATE OF CORRECTION

PATENT NO. : 4,811,371

DATED : March 7, 1989

INVENTOR(S) : John R. Tower

It is certified that error appears in the above-identified patent and that said Letters Patent is hereby corrected as shown below:

Cover page, item [73], change the assignee from "RCA Corporation, New York, N.Y." to --General Electric Company --.

Column 2, line 65, "too" should be --two--.

Column 2, line 66, "therefore" should be --therefor--.

Column 4, line 62, after "signal" insert --.-- (a period).

Column 4, line 64 "$\phi_{SELECT}$" should be --$\phi_{\overline{SELECT}}$--.

Column 5, line 18, "$\phi_{SELECT}$" should be --$\phi_{\overline{SELECT}}$--.

Column 5, line 43, "side-locate" should be --side-located--.

Column 6, line 42, "aid" should be --said--.

Signed and Sealed this

Twenty-first Day of November, 1989

Attest:

JEFFREY M. SAMUELS

Attesting Officer     Acting Commissioner of Patents and Trademarks